(12) United States Patent  (10) Patent No.: US 7,972,438 B2
Fei et al.  (45) Date of Patent: Jul. 5, 2011

(54) HIGH-INDEX UV OPTICAL MATERIALS FOR IMMERSION LITHOGRAPHY

(75) Inventors: Yi-Ting Fei, Oviedo, FL (US); Shen Jen, Longwood, FL (US); Bruce Chai, Oviedo, FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 979 days.

(21) Appl. No.: 11/847,128

(22) Filed: Aug. 29, 2007

(65) Prior Publication Data

US 2008/0055715 A1  Mar. 6, 2008

Related U.S. Application Data

(60) Provisional application No. 60/823,922, filed on Aug. 30, 2006.

(51) Int. Cl.
*C30B 29/30* (2006.01)
(52) U.S. Cl. .............. 117/13; 117/15; 117/20; 117/944
(58) Field of Classification Search .................. 117/13, 117/15, 20, 21, 944
See application file for complete search history.

(56) References Cited

U.S. PATENT DOCUMENTS

| | | | |
|---|---|---|---|
| 3,768,990 A | 10/1973 | Sellers et al. | 65/18 |
| 4,769,080 A * | 9/1988 | Clark et al. | 106/402 |
| 5,885,917 A | 3/1999 | Ohdan et al. | 501/153 |
| 7,256,932 B2 | 8/2007 | Epple et al. | 359/350 |
| 2006/0066962 A1 | 3/2006 | Totzeck et al. | 359/819 |
| 2006/0087629 A1 | 4/2006 | Stone-Sundberg et al. | 355/18 |
| 2006/0245043 A1 | 11/2006 | Wehrhan et al. | 359/350 |
| 2006/0279836 A1 | 12/2006 | Nawata et al. | 359/356 |
| 2007/0091451 A1 | 4/2007 | Schuster | 359/649 |
| 2007/0146904 A1 | 6/2007 | Webb | 359/796 |

FOREIGN PATENT DOCUMENTS

EP  1 701 179 A1  9/2006

OTHER PUBLICATIONS

John H. Burnett et al., "High-Index Materials for 193 nm Immersion Lithography", Proceedings of SPIE vol. 5754—Optical Microlithography XVIII, pp. 1-11.
Doman, R.C. et al; "Solid Solution Studies in the MgO-LiA1O2 System" Feb. 1973; Journal of Materials Science, UK, vol. 8, No. 2; p. 189 col. 1, line 28-p. 191 col. 1, line 46, figures 1,2; table 2.
Roberta L. Millard et al., "Temperature Dependence of Cation Disorder in $MgAl_2O_4$ Spinel Using $^{27}Al$ and $^{17}O$ Magic-Angle Spinning NMR", American Mineralogist, vol. 77, pp. 44-52, 1992.

* cited by examiner

*Primary Examiner* — Robert M Kunemund
(74) *Attorney, Agent, or Firm* — Allen, Dyer, Doppelt, Milbrath & Gilchrist, P.A.

(57) ABSTRACT

This invention is related to material for use as an ultraviolet (UV) optical element and particularly for use as a 193 nm immersion lens element. The material for use as a UV optical element includes a Lithium Magnesium Aluminate (LMAO) body. The specific compound for this application is the disordered lithium magnesium spinel, having the general composition of $Li_xMg_{2(1-x)}Al_{4+x}O_8$ where x=0 to 1 as the high-index UV transparent material for immersion lithography. The LMAO body may include a disordered spinel, such as, for example, a single crystal that may be cubic in symmetry, optically isotropic, and having cation disorder within the structure to reduce the intrinsic birefringence (IBR). The LMAO body has certain desired material properties and may be readily made in relatively large sizes suitable for use as the UV optical element for photolithography.

27 Claims, 7 Drawing Sheets

NOMINAL SAMPLE THICKNESS 3 mm

HIGH-INDEX UV OPTICAL MATERIALS FOR IMMERSION LITHOGRAPHY

RELATED APPLICATION

This application is based upon prior filed provisional application Ser. No. 60/823,922 filed Aug. 30, 2006, the entire subject matter of which is incorporated herein by reference in its entirety.

FIELD OF THE INVENTION

This invention is related to UV optical materials suitable for photolithograpy, and more particularly for 193-nm immersion lithography.

BACKGROUND OF THE INVENTION

High-index UV optical materials may be needed for the next generation immersion lithography to achieve 32-nm image resolution. The image resolution for lithography can be expressed in the following equation:

$$R = K \times \lambda / NA$$

Where R=Image Resolution
K=factor=0.5
$\lambda$=wavelength of light source=193 nm
NA=numerical aperture
=$n_{resist} \sin \theta_{resist}$=$n_{fluid} \sin \theta_{fluid}$=$n_{lens} \sin \theta_{lens}$
$n_x$=index of refraction of respective media x.

Figure 1:
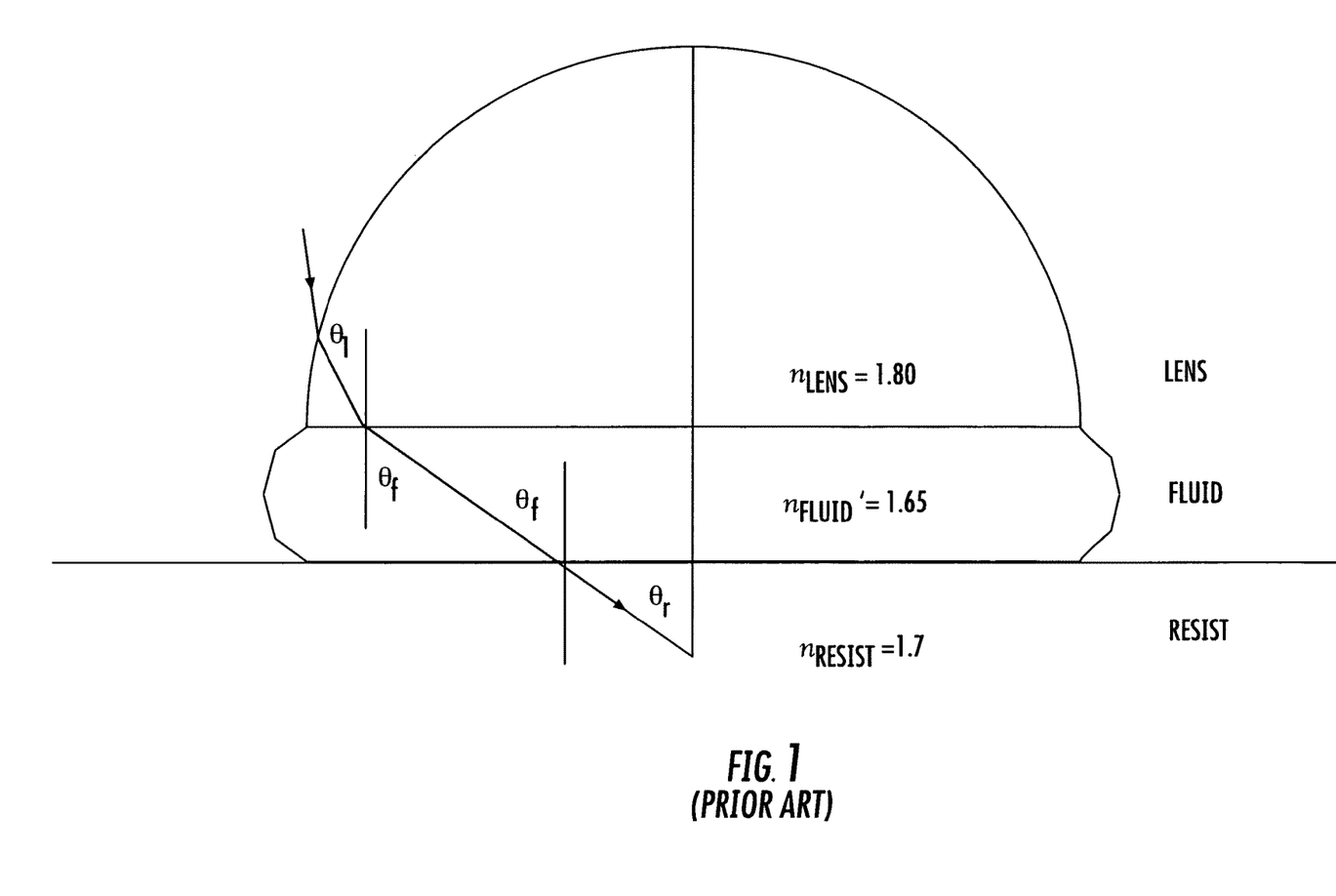
FIG. 1 shows the ideal condition of immersion lithography with high index lens as in the prior art Burnett References.

Clearly, from the equation, to achieve maximum resolution for photolithography one must increase the numerical aperture (NA) of the optical system, since the K factor and the wavelength of the light source are already fixed. The ideal situation to maximize the aperture is that $n_{lens} \geq n_{fluid} \geq n_{resist}$. Since the refractive index of photo-resist is also typically fixed at $n_{resist}$=1.7, it also sets the lower limit of the refractive indices of the immersion fluid and the optical lens. Typical immersion oil has an index of 1.51. Fluid media with even higher indices ($n_{fluid} \geq 1.65$) are being developed. As the refractive index of the immersion fluid increases, the refractive index of the corresponding contact lens also needs to be increased. One would like to have an immersion optical lens with a refraction index greater than 1.7. In "High-index Materials for 193 nm Immersion Lithography", published in the Proceedings of SPIE Vol. 5754, p. 611-621, Optical Microlithography XVIII (2005), J. H. Burnett, S. G. Kaplan, E. L. Shirley, P. J. Tompkins, and J. E. Webb provided a simple illustration for the desirable condition to use the high index lens and fluid to match with the high index of photoresist to achieve maximum NA. (FIG. 1). A current $CaF_2$ lens with a refractive index of 1.50 at 193 nm will not achieve the desired numerical aperture (NA$\geq$1.5).

When selecting suitable compounds for an optical lens, the crystalline candidate materials should be cubic in crystal symmetry and isotropic in optical properties. This desired property eliminates more than 90% of the known compounds. Among the cubic optical transparent materials, fluoride crystals such as $CaF_2$, $SrF_2$ and $BaF_2$ generally have a high band edge (>8 eV) and high transparency (<140 nm) in the short UV range. Unfortunately, because of the highly ionic nature of the chemical bonding, the refractive indices are generally low. The indices of refraction at 193 nm (20° C.) are 1.50, 1.51 and 1.58, respectively. A recent report from Japan by H. Sato, Y. Inui, I. Masada, T. Nawata, E. Nishijima and T. Fukuda, published in the Print of Proceeding of SPIE—Optical Microlithography XIX, San Jose (2006), showed two new fluoride crystals, $KY_3F_{10}$ and $BaLiF_3$, with refractive indices at 193 nm to be 1.59 and 1.64, respectively. It is an improvement over BaF2 but still much less than desired range of greater or equal to 1.7.

It seems clear that in order to achieve the desired refractive index, it is unlikely that fluoride compounds will be suitable. One may look for a wide band gap material in the oxide compounds. Unfortunately, oxide compounds are, in general, less ionic and the oxygen ion is more polarizable. This means that the band edge will be reduced as compared with fluorides. However, it does gain the increase of refractive indices that are desired in this application. The decrease of the band edge is not desirable. This renders most of the oxide compounds unable to meet the desired band edge property of 7.0 eV or higher. The references "High-index materials for 193 nm and 157 nm immersion lithography", in International Symposium on Immersion & 157 nm Lithography, Walt Trybula, ed., International SEMATECH, Austin Tex. (2004), by J. H. Burnett, S. G. Kaplan, E. L. Shirley, and J. E. Webb; "High-index Materials for 193 nm Immersion Lithography", published in the Proceedings of SPIE Vol. 5754, p. 611-621, Optical Microlithography XVIII (2005) by J. H. Burnett, S. G. Kaplan, E. L. Shirley, P. J. Tompkins, and J. E. Webb; and "High-index optical materials for 193-nm immersion lithography", Print of Proceeding of SPIE—Optical Microlithography XIX, San Jose (2006), by J. H. Burnett, S. G. Kaplan, E. L. Shirley, D. Horowitz, W. Clauss, A. Grenville, and C. Van Peski (collectively referred to as the "Burnett References") have documented an extensive search of wide band gap oxide compounds. The Burnett References identify only three groups of compounds—simple oxides, aluminates and garnets—that might display the desired band edge property.

For the simple oxides, MgO seems to be the only option having an adequate band edge of 7.6 eV. None of the other alkali earth oxides (CaO, SrO and BaO) nor the rare earth oxides ($La_2O_3$, $Y_2O_3$, $Lu_2O_3$ and $Sc_2O_3$) has wide enough band gaps to be desirous. So these simple oxides may be eliminated from further consideration. For aluminates, the Burnett References have identified $MgAl_2O_4$ (spinel) and ceramic spinel as the only compounds with adequate band gaps of 7.75 and 7.3 eV, respectively. For the garnets, the Burnett References have identified $Lu_3Al_5O_{12}$ (LuAG) as the only aluminum garnet with barely wide enough band edge ($\approx$ 6.9 eV). This is the only garnet capable to produce large size single crystals with known technology. Silicate garnets such as $Mg_3Al_2Si_3O_{12}$ (pyrope) and $Ca_3Al_2Si_3O_{12}$ (grossular) do have the adequate band edge near 7.5 eV or more. Unfortunately, silicate garnets can only be grown hydrothermally under high temperature and pressure conditions. For example, pyrope requires tens of kilo-bars of pressure to produce such crystals. So it is unlikely using current known technology to be able to produce a large size of these crystals with the high perfection suitable for this application. Another possibility would be the germinate garnets. So far only $Mg_3Al_2Ge_3O_{12}$ has the band edge at 6.7 eV. None of the others have enough band edge for consideration. The germinate garnet can only be produced by flux growth. There is serious doubt that the growth technique will ever make sufficiently high quality crystals for UV optical lens applications.

In addition to the UV transparency or band edge test, another consideration for a UV optical element is the intrinsic birefringence (IBR) test. The lens design has a targeted specification of $\leq$10 nm/cm. MgO has an IBR of $\approx$70 nm/cm. This is too large a value, thus precluding it from further consideration. $MgAl_2O_4$ spinel has one of the highest UV transparencies among the oxide compounds. But its IBR of 52 nm/cm may also be too large to be considered as a suitable UV lens material. Ceramic spinel has the advantage of averaging out the IBR with random orientations of the ceramic grains. However, one drawback is that the ceramic grain structure reduces the light transmittance at 193 nm. Among the garnet materials, LuAG has the highest UV transparency and also the highest index of refraction of 2.14. Moreover, its IBR is 30 nm/cm, which is three times higher than the targeted specification. The reason is due to the very large unit cell with 8 formula units or 160 atoms as compared with 2 atoms per primitive cell for MgO and 14 atoms per primitive cell for $MgAl_2O_4$ spinet. Oxygen ions, with the largest polarizability, form cages surrounding the cations. These cages have many orientations that effectively cancel out the IBR, similar to the ceramic situation with randomly oriented microcrystals.

Another consideration for a UV optical element is the transparency at the 193 nm wavelength. It may be preferable that there be at least 90% transmission through the final lens element of approximately 4 cm thick. This requires an absorption coefficient of $A_{10} \leq 0.01$ cm$^{-1}$. Single crystals are well suited to display such a property, if the band gap of the crystal is larger than 6.41 eV (or 193 nm). To ensure the high transmission at 193 nm, one should select a material with a band gap of 7.0 eV and more preferably greater than 7.5 eV (or 160 nm). Ceramic spinel can have a negligible IBR due to the randomly oriented microcrystals and a large enough band gap of 7.3 eV (170 nm). Unfortunately, typical grain sizes of these microcrystals in a ceramic spinel average 50 microns or more. Such grain boundaries create large scattering to attenuate the optical transmission at 193 nm.

In addition to these transmission considerations, the material of a UV optical element should also perform well in the optical uniformity test. Optical crystals can easily have stress-induced birefringence (SBR). The general lithography optics would require an index homogeneity of ≈1 nm/cm. The core defect of LuAG would not be acceptable for an optical lens. For most crystals without such defect induced inhomogeneity, one can remove most of the SBR by a proper thermal annealing process.

Another consideration for a UV optical element is the ability to produce large size single crystals to make the optics. Among the known compounds under evaluation, MgO has too high a melting point to grow a good quality crystal. $MgAl_2O_4$ spinel also has high melting temperature (2150° C.) that will limit the maximum size crystal available. LuAG has the capability to produce crystals greater than 100 mm in diameter. However, the facet developed during growth will form a core defect that will greatly reduce the usable size of the material. Other garnets under consideration are not congruent melting so that it is doubtful that any of them can be made into a suitable size with a reasonable time or cost.

The final considerations for a material considered for use as a UV optical element are the physical integrity and chemical stability tests. Ideally, it is preferable that the material has no cleavage plane, good hardness and is chemically inert, so it is relatively easy to make into an immersion lens with good chemical and mechanical durability. All the known oxides under evaluation seem to have good mechanical strength. Any new material developed for such application should also pass most or all of these screening tests.

SUMMARY OF THE INVENTION

In view of the foregoing background, it is therefore an object of the present invention to provide a material that has the above noted desirable properties, such as for the use as an ultraviolet (UV) optical element and particularly for use as a 193 nm immersion lens element.

These and other objects, features and advantages in accordance with the invention are provided by a UV optical element comprising a Lithium Magnesium Aluminate (LMAO) body. The LMAO body may comprise a disordered spinel. For example, the LMAO body may comprise a single crystal, and may be cubic in symmetry and optically isotropic. The LMAO body has the desired material properties and may be readily made in relatively large sizes suitable for use as the UV optical element for photolithography. Cation disorder within the structure may also help to reduce the intrinsic birefringence (IBR).

In other embodiments, the LMAO body may comprise a ceramic. The LMAO body may have a refractive index greater than 1.7, and may also have a band gap greater than 7 eV. The LMAO body may have a general formula $Li_xMg_{2(1-x)}Al_{4+x}O_8$ where $0<x<1$. More particularly, $0.05<x<0.95$ and more preferably, wherein $0.5<x<0.9$. In addition, the LMAO body may further comprise at least one of Be, Zn, Cd, B, Sc, Ga, In, Si, and Ge.

Another aspect relates to a photolithographic apparatus comprising a UV source having a wavelength less than 200 nm, and a UV lens cooperating with the UV light source. The UV lens may comprise the Lithium Magnesium Aluminate (LMAO) body.

Yet another aspect relates to a method for making a body to be used as a UV optical element. The method may comprise heating a mixture comprising Lithium Aluminate and Magnesium Aluminate, and forming a Lithium Magnesium Aluminate (LMAO) body from the heated mixture to thereby produce the body to be used as a UV optical element. The LMAO body may be used in UV photolithography, for example.

DETAILED DESCRIPTION OF THE PREFERRED EMBODIMENTS

For illustrative purposes, representative embodiments of the invention are described hereafter in the context of high-index optical materials, such as for 193-nm immersion lithography. It will be understood that the proposed disordered lithium magnesium spinel (LMAO) is not limited to the production of 193-nm immersion lens, but it has the general application of optics and lenses for other UV and visible light applications.

Referring initially to FIG. 1, the figure shows the ideal condition of immersion lithography with high index lens as set forth in the Burnett References.

Figure 2:
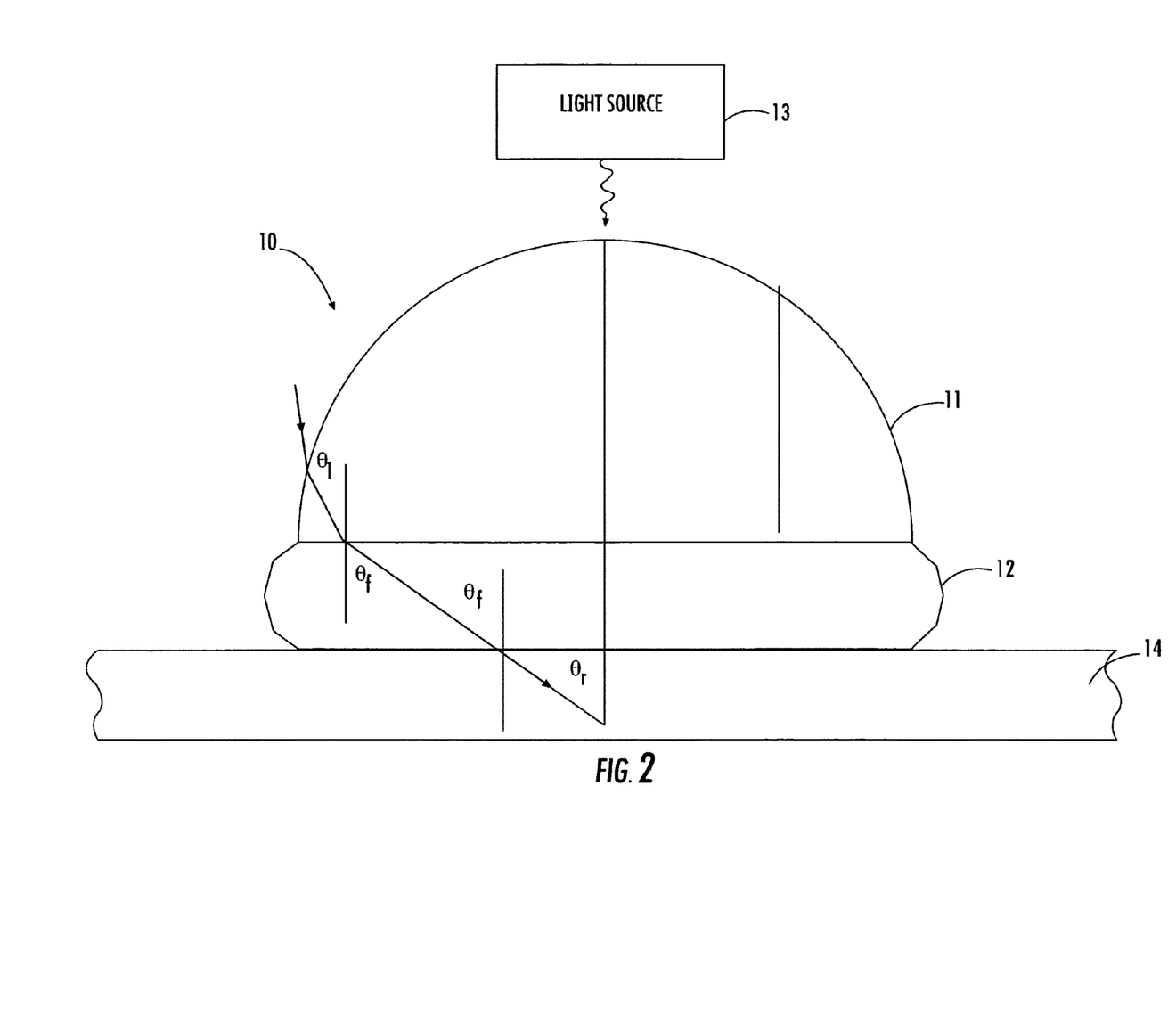
FIG. 2 is a schematic diagram of a photolithographic apparatus as in the invention.

Referring more specifically to FIG. 2, one embodiment of the invention is set forth herein. An optical system for lithography 10, having a LMAO body 11 immersed into immersion fluid 12. A light source 13 emits light through the LMAO body 11, through the immersion fluid 12, and onto the photo-resist 14, the photo-resist 14 having a fixed index of refraction.

As set forth in the background discussion, any material considered for use as a UV optical element should desirably have a combination of the following desirable properties:

1. The material may be cubic in symmetry to be optically isotropic;
2. The material may have a high index of refraction $\geq 1.7$;
3. The material may have a wide band gap $\geq 7.0$ eV;
4. The material may have a low intrinsic birefringence (IBR)$\leq 10$ nm/cm;
5. The material may have a at least 90% transmission with absorption coefficient of $A_{10} < 0.01$ cm$^{-1}$;
6. The material may have a low stress induced birefringence (SBR)$\approx 1$ nm/cm;
7. The material may be capable of being produced in large size and quantities; and
8. The material may have a high physical integrity and chemical stability.

In the background review, a large number of crystals have been evaluated as a potential candidate. But none of them can simultaneously satisfy all eight properties listed above. It is recognized that each of these properties is preferable for a UV optical element, but that certain trade-offs exist among these properties. The prior art has provided no candidate suitable for use as a UV optical element with the proper balance of these desired properties.

We have investigated potential materials capable of striking a balance among these eight desirable properties. We focused our investigation on single crystal materials to achieve high transmission at 193 nm. It is clear that no fluoride can satisfy property 2, thus So, accordingly, only oxide crystals are under consideration. To achieve a wide band gap of over 7 eV, there are only limited cations that can be considered. Only a low atomic weight crystal is believed capable of giving such a band gap. We also need a high ionic nature to reduce the polarizability effect of the oxygen. The elements that we consider primary constituents are Li, Be, B, Mg, Al and Si. We also include a number of closed shell elements as potential additives as modifiers. They are Zn, Cd, Sc, Ga, In and Ge.

By limiting the number of eligible elements, the number of possible compounds may be reduced dramatically. By including property 1 to limit the compounds with only cubic symmetry, there are only two compounds left. They are LiAl$_5$O$_8$ and MgAl$_2$O$_4$. Both of them have a spinel structure with cubic symmetry. The MgAl$_2$O$_4$ spinel is a well-known compound. It has been studied extensively for this application in both single crystal and ceramic form. As mentioned in the Background section, single crystal MgAl$_2$O$_4$ spinel fails to display property 4 with too large of an IBR of 52 nm/cm. The ceramic form MgAl$_2$O$_4$ spinel may also have too high a scattering and too low a transmission and thus fails to display property 5. Moreover, the SBR is also too large ($\geq 100$ nm/cm) due to the stress along the grain boundary. The ceramic form MgAl$_2$O$_4$ spinel also fails to display property 6.

On the other hand, LiAl$_5$O$_8$ spinel was never considered for use as a UV optical element. The reason is very simple. The spinel structure of LiAl$_5$O$_8$ is stable only at high temperatures. There is a destructive phase transition at 1300° C. and the low temperature phase is not spinel in structure. We have made an attempt to grow single crystal of LiAl$_5$O$_8$ spinel. We have no trouble growing a single crystal of LiAl$_5$O$_8$ spinel. The melting temperature of LiAl$_5$O$_8$ spinel at around 1900° C. is much lower than that of MgAl$_2$O$_4$ spinel at 2150° C. This means that the LiAl$_5$O$_8$ spinel is much easier to grow than the MgAl$_2$O$_4$ spinel. The lower melting temperature makes it possible to produce large diameter (or size) single crystals. This is a desirable feature according to property 7. On the other hand, our observation is also consistent with other published results. The crystal looks quite good in the oven while the temperature is high. However, after cooling down to room temperature the crystal turns into opaque white due to phase transition. In fact, we can see the phase transition during cooling.

Despite the phase transition problem, the spinel structure of LiAl$_5$O$_8$ is a good compound for use as a UV optical element. It displays almost all the properties desirable for use as a UV immersion lens. The only property that may not be completely met is property 4. Applicants theorize without wishing to be bound thereto that the spinel structure of LiAl$_5$O$_8$ may be suitable for use as a UV optical element if stabilized down to room temperature.

As mentioned before, at high temperatures both LiAl$_5$O$_8$ and MgAl$_2$O$_4$ have the same spinel structure. We can rewrite the composition of these two compounds as LiAlAl$_4$O$_8$ and MgMgAl$_4$O$_8$ to make a direct comparison. The only difference between the two compounds is that Li+Al replaces two Mg in the regular spinel. In fact, Applicants theorize without wishing to be bound thereto that these two spinels can form complete solid solution with a total disorder of the two sites containing Li, Al and Mg cations. Moreover, the addition of Mg into LiAl$_5$O$_8$ composition should help stabilize the spinel structure from the phase transition.

In addition, we believe that the disorder in the spinel structure is beneficial. This is based on the theory that disorder of the cations in the ceramic spinel and the garnet structure will significantly increase unit cell size. Such disorder may also help to mis-orient polarizable objects so that the polarization effect will be reduced by disorder. If this is true then the mixing of MgAl$_2$O$_4$ in the LiAl$_5$O$_8$ composition will not only stabilize the spinel structure but also create the disorder of the cations to reduce the IBR.

To attempt to further explore this theory, we made the first mixed growth run with a melt composition of 1:1 of LiAl$_5$O$_8$:MgAl$_2$O$_4$. In terms of the general composition of the mixed spinel, Li$_x$Mg$_{2(1-x)}$Al$_{4+x}$O$_8$, here x=⅔=0.667 (or LiMgAl$_7$O$_{12}$). Using this composition, we have successfully produced a Lithium Magnesium Aluminate (LMAO) body, a large spinel single crystal of 60 mm in diameter and 150 mm in length. The growth temperature is higher than pure LiAl$_5$O$_8$ melt but much less than the pure MgAl$_2$O$_4$ melt. There is no evidence of phase transition when the crystal is cooled to room temperature. So the spinel structure has been preserved in this mixed crystal.

Figure 3:
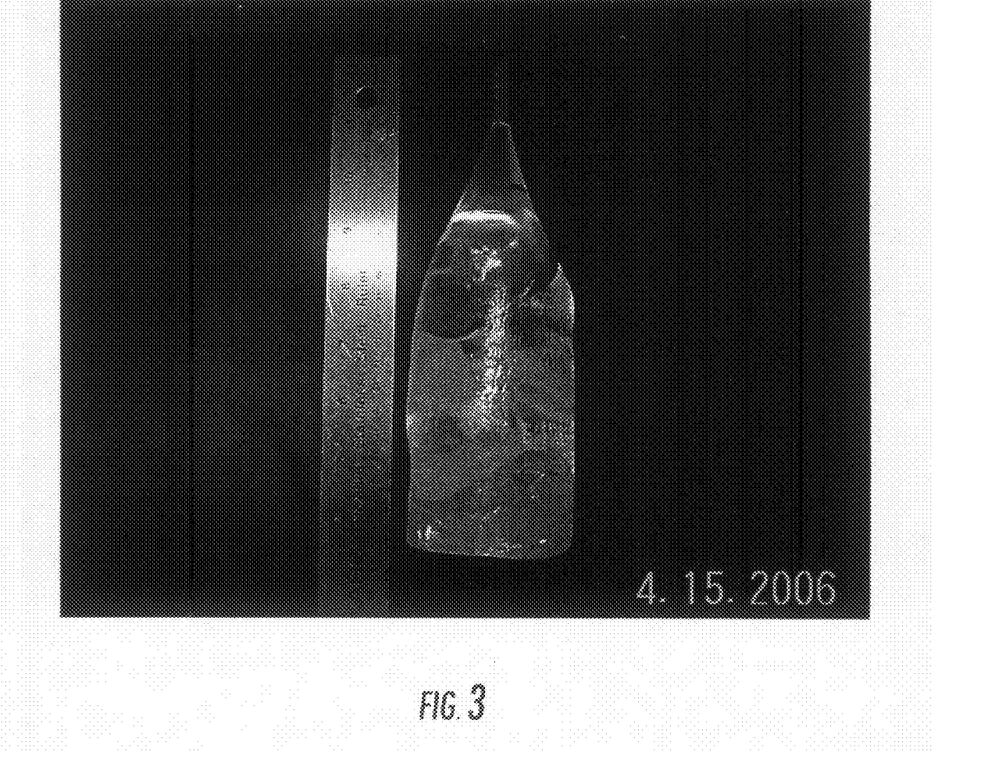
FIG. 3 is a photograph of an as-grown disordered LMAO single crystal with Li to Mg ratio of 2:1 according to the invention.
Figure 4:
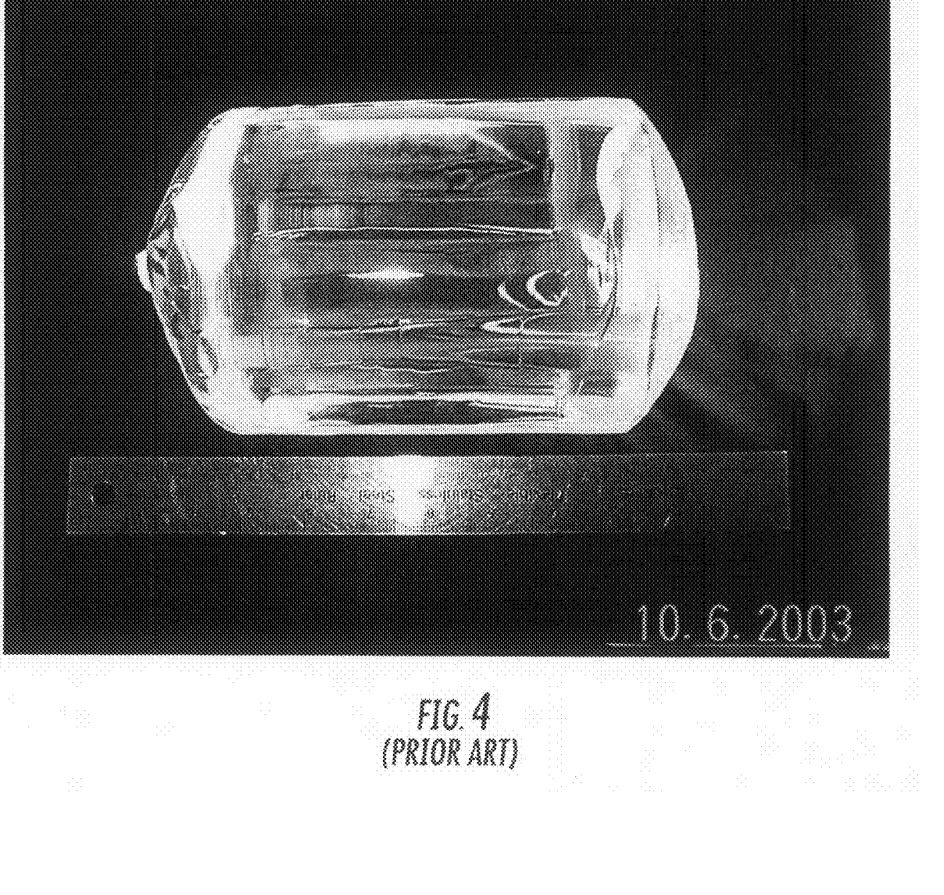
FIG. 4 is a photograph of a 6" diameter clear YAG ($Y_3Al_5O_{12}$) single crystal as in the prior art.

With the success of the first melt, we decided to push further with a greater fraction of the LiAl$_5$O$_8$ melt composition or a 2:1 ratio of LiAl$_5$O$_8$:MgAl$_2$O$_4$. In terms of the general composition of mixed spinel, Li$_x$Mg$_{2(1-x)}$Al$_{4+x}$O$_8$, here x=⅘=0.800 (or Li$_2$MgAl$_{12}$O$_{20}$). Using this composition, we are able to grow an even larger size crystal of 75 mm in diameter and 150 mm in length (FIG. 3). Again, the spinel structure of the LMAO body is preserved when the crystal cools to room temperature. We have subsequently produced single crystals of LMAO with the ratio of $LiAl_5O_8:MgAl_2O_4$ of 4:1 and 8:1. At 4:1 ratio, the mixed spinel, $Li_xMg_{2(1-x)}Al_{4+x}O_8$, will have $x=8/9=0.889$ (or $Li_4MgAl_{22}O_{36}$). At 8:1 ratio, the mixed spinel, $Li_xMg_{2(1-x)}Al_{4+x}O_8$, will have $x=16/17=0.941$ (or $Li_8MgAl_{42}O_{68}$). We plan to find the lower limit of the Mg content in $LiAl_5O_8$ melt to preserve the spinel structure. Applicants theorize without wishing to be bound thereto that the Mg content can be as low as 5% or less and still preserve the spinet structure.

One embodiment of this invention is a disordered lithium magnesium spinel (LMAO) having the general composition of $Li_xMg_{2(1-x)}Al_{4+x}O_8$ where x=0 to 1 as the high-index UV transparent material for immersion lithography. This crystal has the best chance to display all 8 of the desired properties stated herein. The disordered structure of the LMAO body reduces the IBR. This is because there is no more fixed unit cell size. The structure can be glassy in nature for the disordered cations in a structure frame of the Al—O network. However, even with the disordered structure, this crystal can be adjusted in its composition (or Li:Mg ratio) in order to achieve the minimum value of IBR. If just changing the Li:Mg ratio is still not sufficient to achieve the IBR value desired, it is possible to add other dopants with higher atomic weight to increase the compensation to achieve minimum the IBR. The suitable added dopants include but are not limited to Be, Zn, Cd, B, Sc, Ga, In, Si and Ge. The quantity needed will also vary and can be quite significant (>5%). Adding dopants in the disordered structure can reduce the IBR. However, they also have a negative effect of reducing the band gap of the host crystal that may not be desirable. Thus, the type of dopant and the total amount of dopant to be added to LMAO composition need to be carefully considered since it is a compromise between IBR and 193 nm transmission ($A_{10}$).

Another goal is to provide an approach to produce sufficiently large size single crystals of LMAO suitable to make the large immersion lens. As discussed previously, a pure $MgAl_2O_4$ spinel has too high a melting temperature so that it is difficult to produce a large diameter (>75 mm) crystal without the risk of melting the Iridium crucible containing the high temperature melt. The disordered LMAO crystal has a much lower melting point below 2000° C. So it is possible to use the conventional Czochralski melt pulling technique with an Iridium crucible to grow crystals over 6", in diameter or even more. FIG. 3 shows a 6" diameter clear YAG ($Y_3Al_5O_{12}$) single crystal produced by the inventors. YAG has a melting temperature of 1950° C. comparable to that of the LMAO crystal. We believe that the current state-of-the-art crystal growth technology is sufficient to produce large size LMAO single crystals for immersion lenses. One potential concern to growing large size single crystals is the variation of crystal composition from top to bottom due to the equilibrium distribution of each component. To maintain near constant crystal composition may put some extra constraints on the Li:Mg ratio in the crystal as well as the selection of dopants and their optimum quantity. Our growth results show that the disordered LMAO does not fracture nearly as badly as many of the binary solid-solution crystals, suggesting that the distribution coefficients of Li and Mg are relatively similar in order to maintain a relatively constant composition of the crystal. One can certainly limit the fraction of the melt to be used for growth in order to maintain a constant crystal composition. Post growth annealing will be helpful to reduce the stress-induced birefringence (SBR).

So far we have concentrated our discussion on single crystal materials. Similar to regular spinel, a LMAO body can also be made in ceramic form with all the composition variations as single crystals. It is possible that the ceramic form might also suffer the same scattering loss and low transmittance at 193 nm. However, this does not preclude this embodiment to include a ceramic form of LMAO body as part of the invention.

The following are a series of examples that we have conducted for the growth and evaluation of these disordered LMAO crystals. One should know that the approach is not just limited to the examples that we have conducted so far. The examples show, in general, the feasibility of obtaining disordered LMAO body. Additional efforts may be pursued to find the optimum composition based on the 8 desired properties within the composition limit of LMAO for the immersion lens application.

Example 1

Our first effort was to grow a single crystal of pure $LiAl_5O_8$ composition or based on the general formula of LMAO of $Li_xMg_{2(1-x)}Al_{4+x}O_8$ where x=1. We started with 5% excess Li composition of 488.78 gm $Li_2CO_3$ with 3,211.74 gm of $Al_2O_3$, since we worried about the evaporation loss of Li during growth. The charge was melted in an Iridium crucible. We used a pure $MgAl_2O_4$ seed to start the growth. The melting temperature of the charge is around 1900° C. A single crystal of $LiAl_5O_8$ spinel was grown successfully in the first try. In the end, we produced a 60 mm diameter and 150 mm long single crystal weighing 1,522.4 grams. A normal cooling rate of 30 hours was used after growth. Upon reaching room temperature, the crystal was opaque white due to a phase transition at 1300° C.

To be sure of the phase transition, we repeated the growth one more time by remelting the crystal and charge again. We had no trouble pulling a single crystal of the same size of 60 mm in diameter again (based on the facet geometry). After finishing the growth, we decided to rapidly cool the crystal in 10 hours to see if it could prevent the phase transition. The result was the same. The crystal still turned milky white with massive cracks due to rapid cooling. This concluded our observation that it may not be possible to obtain a single crystal of pure $LiAl_5O_8$ composition in the high temperature spinel structure form at room temperature.

Example 2

Our second effort was to grow a single crystal of LMAO with Li:Mg ratio of 1:1 or based on the general formula of LMAO of $Li_xMg_{2(1-x)}Al_{4+x}O_8$ where x=2/3=0.667 or in more simple form of $LiMgAl_7O_{12}$. We reduced the $Li_2CO_3$ by 1/3 down to 325.85 gm and added 127 gm of MgO and the same amount of $Al_2O_3$ of 3,211.74 gm. We used the same growth process as in Example 1 to pull a single crystal of $LiMgAl_7O_{12}$. Because of the addition of MgO, the melting temperature of charge has increased significantly to near 2000° C. Still we were able to produce a single crystal again of 60 mm in diameter and 150 mm in length. The crystal weighed 1,230.7 gm after growth. After the crystal separated from the melt, we let it cool down in normal cooling speed of 30 hours. As expected, the crystal did not have the phase transition and the high temperature spinel structure was preserved down to room temperature for the first time as a disordered LMAO spinel structure. The crystal did crack after growth. This is due to the stress generated by the composition change of the solid solution crystal, since we have used about 1/3 of the total melt for growth. At the beginning of the growth the crystal is more Mg rich than the bottom of the crystal that is more Li rich.

Example 3

With the success of the 3$^{rd}$ growth in Example 2, we decided to push the composition to more Li rich side to see how little the Mg is needed to preserve the high temperature spinel structure in disordered LMAO. This time, we decided to grow a single crystal of LMAO with Li Mg ratio of 2:1 or based on the general formula of LMAO of $Li_xMg_{2(1-x)}Al_{4+x}O_8$ where x=4/5=0.800 or $Li_2MgAl_{12}O_{20}$. In this structure 80% of the composition is Li-spinel and only 20% is Mg-spinel. The total charge of the melt was essentially the same as the two previous examples except that $Li_2CO_3$ has increased to 391 gm and MgO has reduced to 53 gm. We apply the same growth process as the previous examples except that we further increase the crystal diameter to 75 mm. Again, we were successful in pulling a single crystal of $Li_2MgAl_{12}O_{20}$. Because of the larger diameter, the finished crystal weighed 1,852.5 gm or near 60% of the total melt (FIG. 3). We applied the same normal cooling of 30 hours. Again, there is no phase transition and the disordered spinel structure was preserved down to room temperature. Again, we saw some cracking due to stress induced by the solid solution the same as Example 2. Compared with other solid solution crystals with a variable composition, the cracking of the LMAO body is not as serious. We believe that it is possible to grow a large size LMAO crystal without cracking by limiting the fraction of the melt used for growth. The results seem to indicate that we can further reduce the Mg content, perhaps down to 10%, and still preserve the disordered spinel structure.

Example 4

Figure 5:
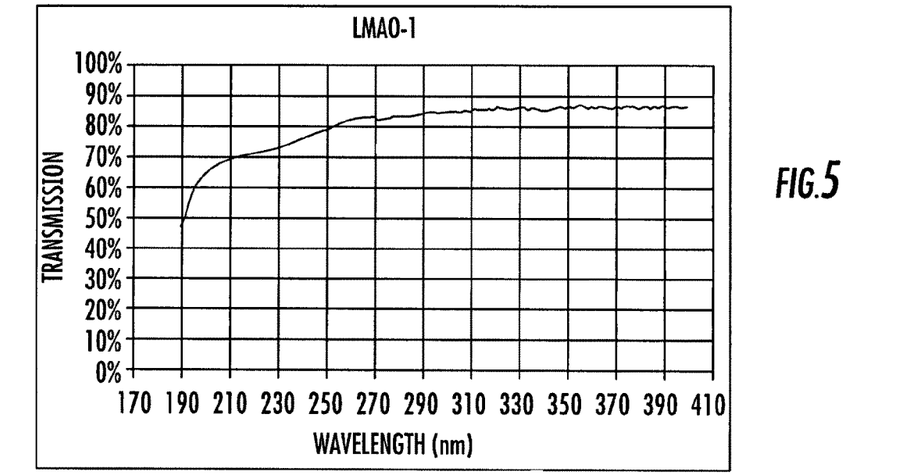
FIG. 5 is a UV transmittance spectrum of a 3 mm thick LMAO of the composition $Li_xMg_{2(1-x)}Al_{4+x}O_8$ where x=⅘=0.800 or $Li_2MgAl_{12}O_{20}$ according to the invention
Figure 6:
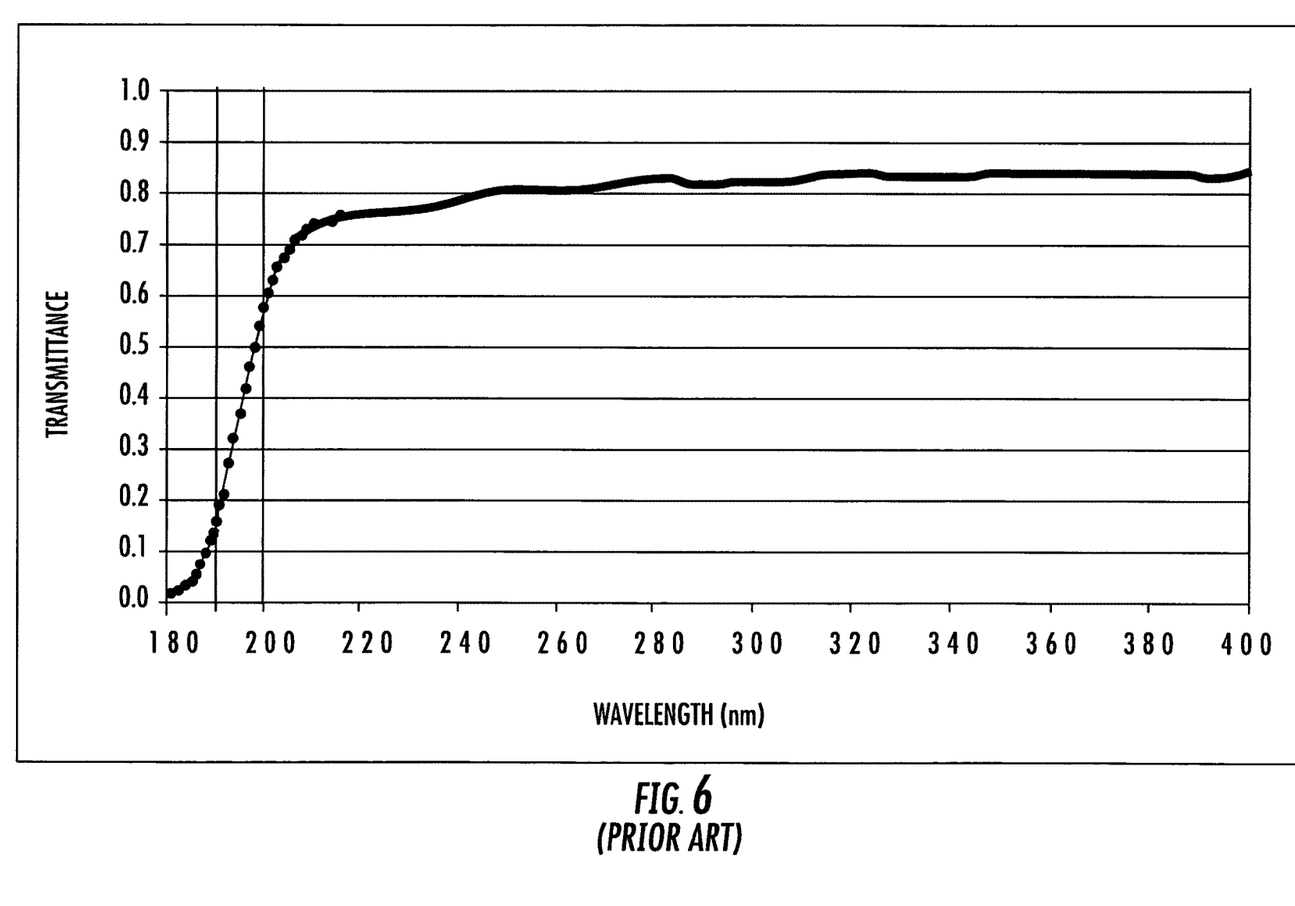
FIG. 6 is a UV transmittance spectrum of pure $MgAl_2O_4$ spinel as in the prior art Burnett References.

To demonstrate that the proposed disordered LMAO spinel has the adequate band gap for 193 nm immersion lithography optical lens, crystals of LMAO with Li:Mg ratio of 2:1 or based on the general formula of LMAO of $Li_xMg_{2(1-x)}Al_{4+x}O_8$ where x=4/5=0.800 or $Li_2MgAl_{12}O_{20}$ from examples 3 were cut to 3 mm thick plates and polished for optical transmission measurement. The optical quality of the plate is excellent without any inclusions or other scattering centers. The transmittance spectrum is shown in FIG. 5. To make a direct comparison of the result with pure $MgAl_2O_4$ spinel, we copy the transmittance spectrum reported by J. H. Burnett, S. G. Kaplan, E. L. Shirley, P. J. Tompkins, and J. E. Webb in FIG. 8 of "High-index Materials for 193 nm Immersion Lithography", Proceedings of SPIE Vol. 5754, p. 611-621—Optical Microlithography XVIII (2005) herein in FIG. 6. Comparing FIGS. 5 and 6, we can see that the 2:1 LMAO has 56% transmission at 193.4 nm which is near twice that of pure $MaAl_2O_4$ spinel (30%). FIG. 5 also shows clearly absorption starting around 260 nm due to impurities within the crystal. We did not use highest purity chemicals in our trial run. What we intended to demonstrate is that LMAO has larger band gap and higher UV transparency than pure $MgAl_2O_4$ spinel.

Example 5

Figure 7:
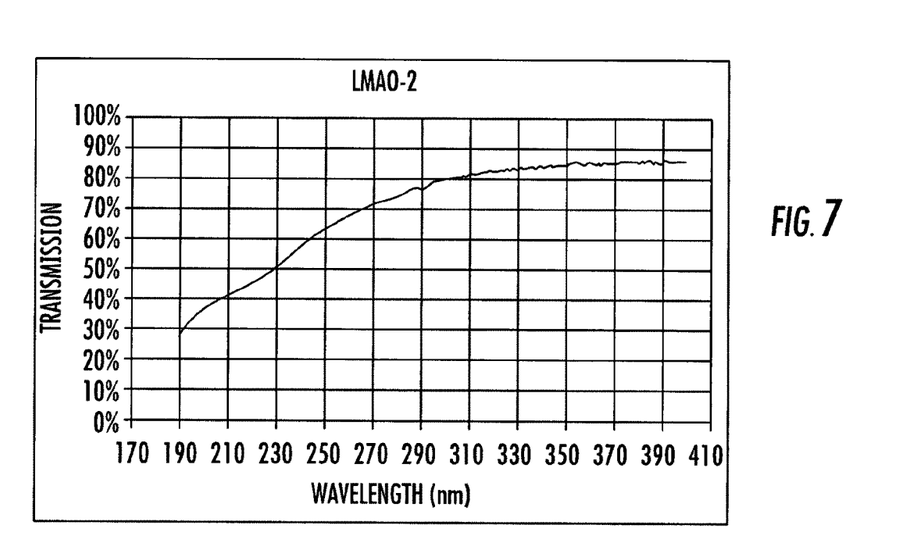
FIG. 7 is a UV transmittance spectrum of 3 mm thick LMAO of the composition $Li_xMg_{2(1-x)}Al_{4+x}O_8$ where x=⅘=0.889 or $Li_4MgAl_{22}O_{36}$ according to the invention.
Figure 8:
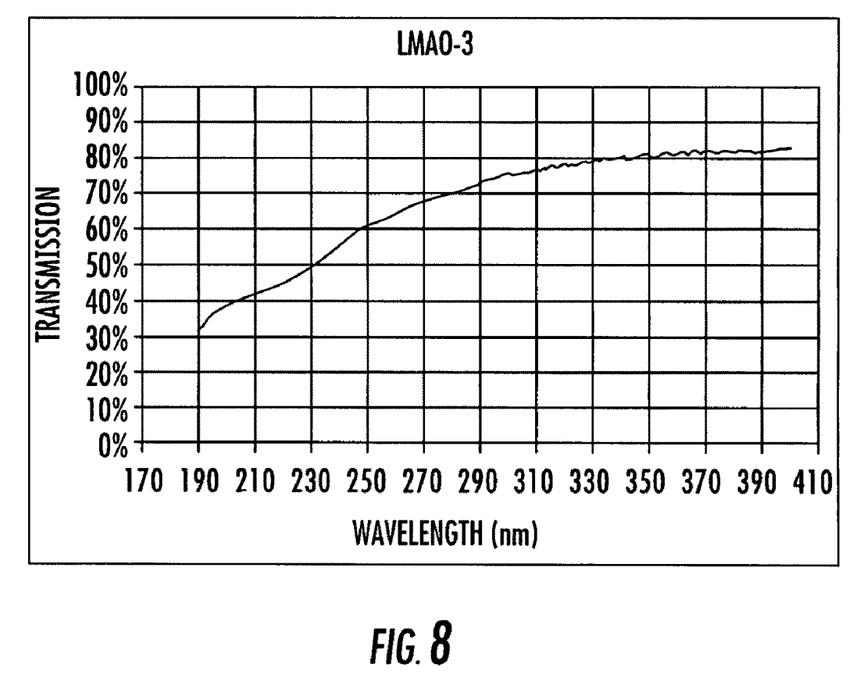
FIG. 8 UV transmittance spectrum of 3 mm thick LMAO of the composition $Li_xMg_{2(1-x)}Al_{4+x}O_8$ where x=16/17=0.941 (or $Li_8MgAl_{42}O_{68}$) according to the invention.

The result of Example 4 seems to indicate that LMAO spinel should have a higher UV transmission (or wider band gap) with a higher Li content. To demonstrate such an effect, we have grown two more singles of LMAO with the ratio of $LiAl_5O_8:MgAl_2O_4$ of 4:1 and 8:1. At 4:1 ratio, the mixed spinel, $Li_xMg_{2(1-x)}Al_{4+x}O_8$, will have x=8/9=0.889 (or $Li_4MgAl_{22}O_{36}$). At 8:1 ratio, the mixed spinel, $Li_xMg_{2(1-x)}Al_{4+x}O_8$, will have x=16/17=0.941 (or $Li_8MgAl_{42}O_{68}$). The growth procedure is exactly the same as those illustrated in Examples 2 and 3 except that the starting composition contains even more Li and less Mg. Single crystals were produced in either composition and there is no evidence of phase transition in both cases. However, there seems to have a tendency of increasing fracture with higher Li content. The crystals of both compositions also show more inclusions. We have prepared optical plates of 3 mm thick from both crystals. We can clearly see inclusions in these plates. The UV transmittance spectra of either composition are shown in FIGS. 7 and 8. The result is not as good as the spectrum of 2:1 ratio (FIG. 5). Clearly, the inclusions do cause an overall reduction of optical transmittance. Moreover, the spectra also show higher impurity contaminations in these two crystals. Despite the extra absorptions due to impurities, both spectra show the trend of further blue-shifted into the deeper UV region.

We have investigated a range of compositions of the new disordered solid solution compound, lithium magnesium aluminate spinel. Based on the current results, Applicants theorize without wishing to be bound thereto that the preferred composition may be approximately 3:1 ratio of lithium to magnesium. In terms of the mixed spinel, $Li_xMg_{2(1-x)}Al_{4+x}O_8$, we will have x=6/7=0.857 (or $Li_3MgAl_{17}O_{28}$).

While the invention has been described, disclosed, illustrated and shown in various terms of certain embodiments or modifications which it has presumed in practice, the scope of the invention is not intended to be, nor should it deemed to be, limited thereby and such other modifications or embodiments as may be suggested by the claims appended hereto.

That which is claimed is:

1. An ultraviolet (UV) optical element comprising:
   a Lithium Magnesium Aluminate (LMAO) body comprising a single crystal.
2. The UV optical element according to claim 1 wherein said LMAO body comprises a disordered spinel.
3. The UV optical element according to claim 1 wherein said LMAO body is cubic in symmetry and optically isotropic.
4. The UV optical element according to claim 1 wherein said LMAO body has a refractive index greater than 1.7.
5. The UV optical element according to claim 1 wherein said LMAO body has a band gap greater than 7 eV.
6. The UV optical element according to claim 1 wherein said LMAO body has a general formula $Li_xMg_{2(1-x)}Al_{4+x}O_8$ where 0<x<1.
7. The UV optical element according to claim 6 wherein 0.05≦x≦0.95.
8. The UV optical element according to claim 6 wherein 0.5<x<0.9.
9. The UV optical element according to claim 1 wherein said LMAO body further comprises at least one of Be, Zn, Cd, B, Sc, Ga, In, Si, and Ge.
10. A photolithographic apparatus comprising:
    an ultraviolet (UV) source having a wavelength less than 200 nm; and
    a UV lens cooperating with said UV light source and comprising a Lithium Magnesium Aluminate (LMAO) body.
11. The photolithographic apparatus according to claim 10 wherein said LMAO body comprises a single crystal disordered spinel cubic in symmetry and optically isotropic.
12. The photolithographic apparatus according to claim 10 wherein said LMAO body has a refractive index greater than 1.7, and a band gap greater than 7 eV.
13. The photolithographic apparatus according to claim 10 wherein said LMAO body has a general formula $Li_xMg_{2(1-x)}Al_{4+x}O_8$ where 0<x<1.
14. The photolithographic apparatus according to claim 13 wherein 0.05<x<0.95.

15. The photolithographic apparatus according to claim 10 wherein said LMAO body further comprises at least one of Be, Zn, Cd, B, Sc, Ga, In, Si, and Ge.

16. A method for making a body to be used as an ultraviolet (UV) optical element, the method comprising:
heating a mixture comprising Lithium Aluminate and Magnesium Aluminate; and
forming a Lithium Magnesium Aluminate (LMAO) body from the heated mixture to thereby produce the body to be used as a UV optical element.

17. The method according to claim 16 wherein the mixture comprises a predetermined ratio of Lithium Aluminate and Magnesium Aluminate; and further wherein the heating and forming are selected so that the LMAO body comprises a single crystal disordered spinel cubic in symmetry and optically isotropic.

18. The method according to claim 16 wherein the mixture comprises a predetermined ratio of Lithium Aluminate and Magnesium Aluminate; and further wherein the heating and forming are selected so that the LMAO body comprises a ceramic.

19. The method according to claim 16 wherein the mixture comprises a predetermined ratio of Lithium Aluminate and Magnesium Aluminate; and further wherein the heating and forming are selected so that the LMAO body has a refractive index greater than 1.7, and a band gap greater than 7 eV.

20. The method according to claim 16 wherein the mixture comprises a predetermined ratio of Lithium Aluminate and Magnesium Aluminate; and further wherein the heating and forming are selected so that the LMAO body has a general formula $Li_xMg_{2(1-x)}Al_{4+x}O_8$ where $0<x<1$.

21. The method according to claim 20 wherein $0.05<x<0.95$.

22. The method according to claim 16 further comprising adding at least one of Be, Zn, Cd, B, Sc, Ga, In, Si, and Ge to the mixture.

23. The method according to claim 16 wherein forming comprises using a Czochralski melt pulling technique.

24. An ultraviolet (UV) optical element comprising:
a Lithium Magnesium Aluminate (LMAO) body comprising a disordered spinel.

25. An ultraviolet (UV) optical element comprising:
a Lithium Magnesium Aluminate (LMAO) body being cubic in symmetry and optically isotropic.

26. The UV optical element according to claim 25 wherein said LMAO body comprises a ceramic.

27. An ultraviolet (UV) optical element comprising:
a Lithium Magnesium Aluminate (LMAO) body;
wherein said LMAO body has a general formula $Li_xMg_{2(1-x)}Al_{4+x}O_8$ where $0<x<1$.

* * * * *